(12) United States Patent
Tsuchida

(10) Patent No.: US 9,666,542 B2
(45) Date of Patent: May 30, 2017

(54) WIRING SUBSTRATE AND MANUFACTURING METHOD THEREOF

(71) Applicant: NEC Corporation, Tokyo (JP)

(72) Inventor: Junichi Tsuchida, Tokyo (JP)

(73) Assignee: NEC CORPORATION, Tokyo (JP)

(*) Notice: Subject to any disclaimer, the term of this patent is extended or adjusted under 35 U.S.C. 154(b) by 204 days.

(21) Appl. No.: 14/494,974

(22) Filed: Sep. 24, 2014

(65) Prior Publication Data

US 2015/0083470 A1 Mar. 26, 2015

(30) Foreign Application Priority Data

Sep. 24, 2013 (JP) .................................. 2013-196451

(51) Int. Cl.
*H01L 23/64* (2006.01)
*H01L 23/66* (2006.01)

(52) U.S. Cl.
CPC .............. *H01L 23/64* (2013.01); *H01L 23/66* (2013.01); *H01L 2924/0002* (2013.01); *Y10T 29/49165* (2015.01)

(58) Field of Classification Search
CPC . H01L 23/64; H01L 23/66; H01L 2924/0002; H01L 2924/00; Y10T 29/49165
See application file for complete search history.

(56) References Cited

U.S. PATENT DOCUMENTS 6,765,298 B2 * 7/2004 Chin ................... H01L 23/5383
257/211
8,125,047 B2 2/2012 Takahashi 2001/0020731 A1 9/2001 Takamura
2002/0038907 A1 * 4/2002 Miyamoto ........ H01L 23/49572
257/686
2006/0238984 A1 * 10/2006 Belady .................. H01L 23/367
361/704

(Continued)

FOREIGN PATENT DOCUMENTS

JP          2001168288       6/2001
JP          2010-068313      3/2010
WO     WO 2007/083354       7/2007

OTHER PUBLICATIONS

Japanese Office Action, dated Oct. 14, 2014, in corresponding Japanese Patent Application No. 2013-196451, with partial English translation.

*Primary Examiner* — Hoa C Nguyen
(74) *Attorney, Agent, or Firm* — Young & Thompson

(57) ABSTRACT

A wiring substrate is provided with a support substrate (31), an insulating layer (32), and a wiring layer (33). The support substrate (31) is formed with a hole (34) including an opening portion in one surface of the support substrate (31). The insulating layer (32) is formed on a surface of the support substrate (31) opposite to the one surface thereof including the opening portion. The wiring layer (33) includes a wiring pattern of a predetermined structure on the insulating layer (32). Further, an orthographic projection to be obtained when the wiring pattern is projected on a predetermined surface of the support substrate (31), and an orthographic projection to be obtained when the hole (34) is projected on the predetermined surface of the support substrate (31) include a shared portion.

5 Claims, 5 Drawing Sheets

(56) References Cited

U.S. PATENT DOCUMENTS

| | | | |
|---|---|---|---|
| 2009/0111244 A1* | 4/2009 | Yamazaki | B23K 26/03 |
| | | | 438/458 |
| 2009/0115029 A1* | 5/2009 | Koyama | H01L 21/76254 |
| | | | 257/632 |
| 2009/0185700 A1* | 7/2009 | Suzuki | H04R 19/005 |
| | | | 381/174 |
| 2010/0059896 A1 | 3/2010 | Makita et al. | |
| 2011/0298021 A1* | 12/2011 | Tada | H01L 21/02126 |
| | | | 257/288 |
| 2014/0264583 A1* | 9/2014 | Yamaji | H01L 27/088 |
| | | | 257/339 |

* cited by examiner

WIRING SUBSTRATE AND MANUFACTURING METHOD THEREOF

This application is based upon and claims the benefit of priority from Japanese Patent Application No. 2013-196451, filed on Sep. 24, 2013, the disclosure of which is incorporated herein in its entirety by reference.

TECHNICAL FIELD

The present invention relates to a technique of forming wirings on a silicon substrate, and more particularly, to a technique of forming a coplanar wiring on a silicon substrate.

BACKGROUND ART

With the development of high-performance information devices and high-speed communications, a fine wiring and the like is formed in an electronic device to cope with a demand for a high-frequency signal or an increase in the number of signal wirings. It may be hard to apply a method for mounting a semiconductor device or an electronic component on a printed wiring board to a device requiring a high-frequency signal, since a variation and the like in electrical characteristics of wirings may affect a signal. Therefore, development of a wiring substrate capable of coping with a demand for a high-frequency signal has been progressing. As a technique of coping with a demand for a high-frequency signal or a high-density wiring, there is proposed a technique relating to a silicon interposer, for instance. A silicon interposer is configured such that semiconductor devices such as memory devices or arithmetic units are mounted on a silicon substrate, and the devices are connected to each other by wirings formed on the silicon substrate. In the silicon interposer, it is possible to reduce the wiring length or the wiring width by connecting the devices to each other by the wirings formed on the silicon substrate. This makes it possible to reduce a parasitic capacitance between the wirings or a variation in the wiring length, which are the problems in a high-frequency signal.

An influence of a parasitic capacitance may occur even if wirings are formed on a silicon substrate. The above configuration may be insufficient as a technique of coping with a demand for a further high-frequency signal or a further high-density wiring. In order to cope with a demand for a higher frequency-signal or a higher density wiring, it is necessary to provide a technique of further reducing the parasitic capacitance between the wirings for reducing a signal delay or signal attenuation resulting from the parasitic capacitance or the like. In view of the above, the technique of coping with a demand for a high-frequency signal or a high-density wiring such as reduction of a parasitic capacitance between wirings formed on a silicon substrate has been developing actively. As a technique relating to formation of wirings on a silicon substrate in order to cope with a demand for a high-frequency signal, there is disclosed a technique for instance, Patent Literature 1 (Japanese Laid-open Patent Publication No. 2010-68313).

Patent Literature 1 discloses a technique of reducing attenuation of a signal to be transmitted by a coplanar wiring formed on a silicon substrate. The coplanar wiring in Patent Literature 1 is formed on an insulating layer formed on a silicon substrate. In Patent Literature 1, an insulating layer between a signal wiring and a GND (Ground) wiring, and a region in the vicinity of a surface of a silicon substrate are removed. Patent Literature 1 discloses that removing the insulating layer between the signal wiring and the GND wiring makes it possible to prevent formation of a low-resistance layer, which may be a cause for leakage and the like of electricity in the vicinity of the interface between the insulating layer and the silicon substrate. In Patent Literature 1, forming the above structure makes it possible to reduce the thickness of the insulating layer to such a degree capable of insulating between the signal wiring and the GND wiring, and the silicon substrate. This is advantageous in easily manufacturing a coplanar wiring substrate. Thus, Patent Literature 1 discloses that it is possible to provide a coplanar wiring substrate at a low cost with ease.

Patent Literature 2 (International Laid-open Patent Publication No. 2007/083354) discloses a technique of reducing attenuation of a high-frequency signal in a wiring unit of a semiconductor device. The semiconductor device of Patent Literature 2 includes a structure with a SOI (Silicon On Insulator) layer, and includes a coplanar wiring unit formed on the upper portion of the SOI layer. In Patent Literature 2, a hollow portion is formed in a silicon substrate and the like at a position below a signal wiring. The hollow portion is not in a completely hollow state at a position right below the signal wiring, but a pillar remains in the hollow portion for preventing crush of the hollow portion. Patent Literature 2 discloses that forming a structure such that a pillar remains at a position right below the signal wiring makes it possible to form a large hollow portion, and this is advantageous in sufficiently reducing a dielectric loss. Patent Literature 2 discloses that, as a result, it is possible to reduce attenuation of a high-frequency signal, while securing reliability of the mechanical strength.

However, the technique of Patent Literature 1 has the following problem. In Patent Literature 1, an embedded portion of the insulating layer between the signal wiring and the GND wiring, and of the silicon substrate is formed by etching. As a pattern becomes finer by etching, the degree of difficulty of the etching process increases. Therefore, as the interval between signal wirings is narrowed, it may be difficult to form an embedded portion of the insulating layer and of the silicon substrate. Further, the degree of difficulty of the step of forming a structure having a corner portion such as a bent portion of a wiring by etching is high. The degree of difficulty of etching the structure further increases, as the pattern becomes finer. Thus, in the technique of Patent Literature 1, it may be difficult to form wirings requiring a fine and intricate circuit pattern.

Further, the technique of Patent Literature 2 has the following problem. In Patent Literature 2, a hollow portion is formed at a position right below the wiring. Therefore, it is necessary to form the hollow portion after an upper layer at a position above the hollow portion such as a SOI layer or a wiring layer is formed. In order to form the hollow portion at a position right below the SOI layer or the wiring layer, it is necessary to etch a lower layer via an opening portion, which is narrower than the hollow portion formed in the SOI layer or in the wiring layer. Therefore, it is difficult to control the process in the etching step, and a variation is likely to occur in the size of the hollow portion or of the pillar portion due to a difference in density of wirings. In particular, the influence is noticeable in forming a pattern having a narrow wiring interval. In the technique of Patent Literature 2, the process for forming a hollow portion may be complicated, and the number of steps may largely increase in order to precisely form the hollow portion on a fine pattern having a narrow wiring interval. Further, etching residues may remain in the hollow portion in a cleaning step and the like, which is performed after the hollow portion is formed. This may adversely affect the reliability. Therefore, the technique of Patent Literature 2 is also insufficient as a technique to be used in forming wirings requiring a fine and intricate circuit pattern.

An object of the invention is to provide a wiring substrate that enables to reduce attenuation of a signal without the need of complicated steps or the like, even when a fine and intricate wiring pattern is to be formed.

SUMMARY

A wiring substrate of the invention is provided with a support substrate, an insulating layer, and a wiring layer. The support substrate is formed with a hole including an opening portion in one surface of the support substrate. The insulating layer is formed on a surface of the support substrate opposite to the one surface including the opening portion. The wiring layer includes a wiring pattern of a predetermined structure on the insulating layer. Further, an orthographic projection to be obtained when the wiring pattern is projected on a predetermined surface of the support substrate, and an orthographic projection to be obtained when the hole is projected on the predetermined surface of the support substrate include a shared portion.

Further, a wiring substrate manufacturing method of the invention includes a step of forming a hole in one surface of a support substrate; a step of forming an insulating layer on a surface of the support substrate opposite to the one surface including the hole; and a step of forming a wiring pattern of a predetermined structure on the insulating layer. In the wiring substrate manufacturing method, the hole and the wiring pattern are formed in such a manner that an orthographic projection to be obtained when the wiring pattern is projected on a predetermined surface of the support substrate, and an orthographic projection to be obtained when the hole is projected on the predetermined surface of the support substrate include a shared portion.

BRIEF DESCRIPTION OF THE DRAWINGS

Exemplary features and advantages of the present invention will become apparent from the following detailed description when taken with the accompanying drawings in which.

EXEMPLARY EMBODIMENT

Figure 1:
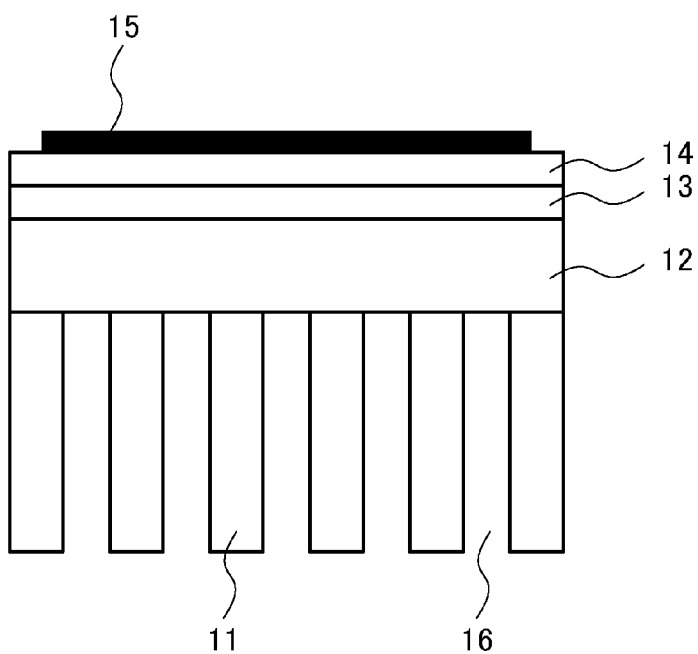
FIG. 1 is a diagram illustrating an outline of a configuration of a first exemplary embodiment.

The first exemplary embodiment of the invention will be described in detail with reference to the drawings. FIG. 1 illustrates an outline of a configuration of a coplanar wiring substrate in the exemplary embodiment. The coplanar wiring substrate in the exemplary embodiment is provided with a support substrate 11, a BOX (Buried OXide) layer 12, a SOI (Silicon On Insulator) layer 13, an insulating layer 14, and a wiring layer 15. Further, a plurality of holes 16 are formed in the support substrate 11.

The support substrate 11 is a substrate with characteristics of a semiconductor. The support substrate 11 has a function as a structure material for retaining the mechanical strength of the entirety of the coplanar wiring substrate. Further, the support substrate 11 has a mechanical strength sufficient for transport and treatment in each of the steps when the coplanar wiring substrate is manufactured. In the exemplary embodiment, a single crystal silicon substrate is used as the support substrate 11. It is possible to use a silicon substrate of 0.7 mm in thickness for instance, as the silicon substrate. Further, the silicon substrate has a portion in the shape for adjusting the position and the orientation of the silicon substrate at the time of manufacturing. As the portion in the shape for adjusting the position and the orientation of the substrate, for instance, a notch or an orientation flat is formed. In the exemplary embodiment, a notch is formed in the silicon substrate.

The BOX layer 12 is formed as a silicon oxide ($SiO_2$) film layer of a predetermined film thickness. The BOX layer 12 is also referred to as an embedded oxide film. The predetermined film thickness of the silicon oxide film of the BOX layer 12 in the exemplary embodiment is set to be 2 µm. The SOI layer 13 is formed as a single crystal silicon layer of a predetermined film thickness. The predetermined film thickness of the SOI layer 13 made of single crystal silicon in the exemplary embodiment is set to be 200 nm. The insulating layer 14 is formed by using a silicon compound having insulation characteristics such as a silicon oxide ($SiO_2$) film, a silicon nitride (SiN) film, or a silicon oxide nitride (SiON) film. It is also possible to form the insulating layer 14 by laminating films of two or more different kinds of components. The insulating layer 14 in the exemplary embodiment is formed of a silicon oxide film. Further, the silicon oxide film of the insulating layer 14 is formed to have a film thickness of 200 nm.

Figure 2:
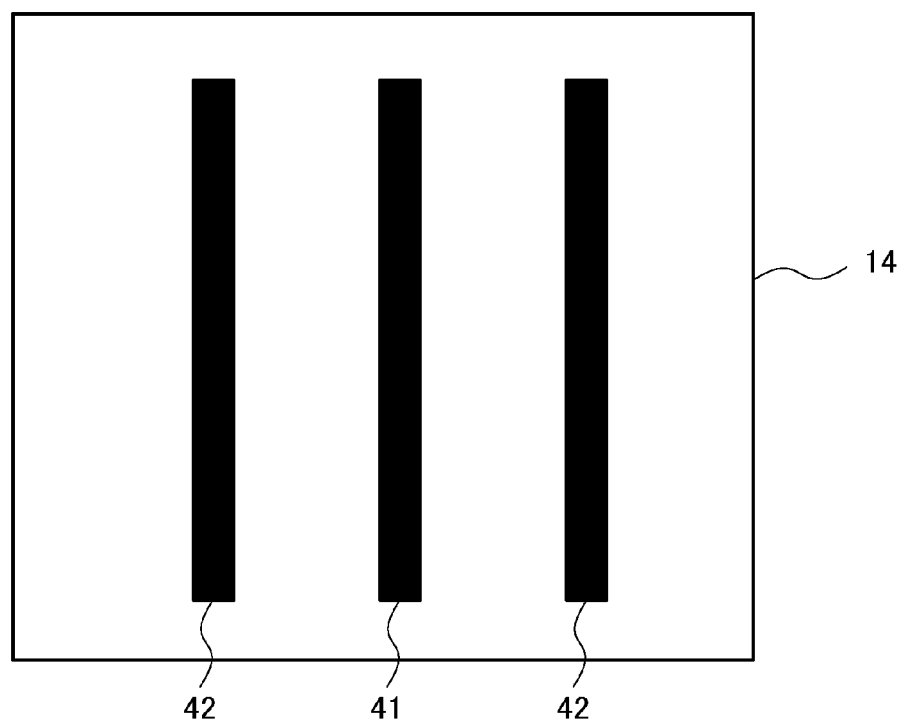
FIG. 2 is a diagram schematically illustrating a wiring structure in the first embodiment.

The wiring layer 15 is formed with use of a metal such as aluminum or copper, or an alloy of these metals and other metals. A predetermined circuit pattern is formed on the wiring layer 15 in accordance with the purpose of use of the coplanar wiring substrate. Further, the wiring layer 15 is constituted of a coplanar structure, in which a signal wiring and a GND (Ground) wiring adjoin each other on one layer. FIG. 2 schematically illustrates wirings of a coplanar structure to be formed on the wiring layer 15. As illustrated in FIG. 2, the wirings in the exemplary embodiment are configured such that one signal wiring 41 formed on the insulating layer 14, and two GND wirings 42 formed on both sides of the signal wiring 41 on the same layer as the signal wiring 41 are combined with each other. In the exemplary embodiment, the wiring layer 15 is formed to have a film thickness of 200 nm. The film thickness of each layer in the previous description is an example. The film thickness of each of the BOX layer 12, the SOI layer 13, the insulating layer 14, and the wiring layer 15 is set based on electrical characteristics required in the coplanar wiring substrate.

The holes 16 are formed in a silicon substrate as the support substrate 11. The holes 16 are formed to penetrate the silicon substrate from a surface thereof opposite to the surface thereof where the BOX layer 12 is formed to the surface on the side of the BOX layer 12. Further, the holes 16 are arranged in a lattice pattern. Arranging the holes 16 in a lattice pattern makes it possible to uniformly distribute the stress exerted on the support substrate 11. This is advantageous in reducing distortion of the substrate, while retaining a predetermined mechanical strength. The holes 16 are arranged, for instance, in a lattice pattern so that all the distances between the centers of the holes adjacent to each other are equal to each other. The diameter of the holes 16 is set in the range of 50 μm to 100 μm, for instance. The interval between the holes 16 in this configuration is set in the range of 150 μm to 200 μm, for instance. The holes 16 may not be formed over the entire surface of the substrate, but may be formed only at positions below wirings or pads. Further, the holes 16 may be formed in advance only at positions where wirings or pads are highly likely to be densely arranged.

Next, a coplanar wiring substrate manufacturing method in the exemplary embodiment will be described. First, the BOX layer 12 and the SOI layer 13 are formed on a silicon substrate as the support substrate 11. The BOX layer 12 and the SOI layer 13 are formed by a process such as a SIMOX (Separation by IMplantation of OXygen) process or a laminating process. The SIMOX process is a process, in which oxygen molecules are implanted into a silicon substrate from a surface thereof by ion implantation, and a silicon oxide film layer as the BOX layer 12 is formed at an inner position than the surface of the silicon substrate by reacting oxygen and silicon at a high temperature. The laminating process is a process, in which another silicon substrate is laminated on a silicon substrate formed with a silicon oxide film layer as the BOX layer 12, and thereafter, the SOI layer 13 is formed on the backside surface of the another silicon substrate by polishing.

Subsequently, the holes 16 are formed in the support substrate 11 formed with the BOX layer 12 and the SOI layer 13. The holes 16 may be formed, for instance, by combining a photolithography process and an etching process. A photoresist is applied on the surface of the silicon substrate as the support substrate 11 opposite to the SOI layer 13. The applied photoresist is exposed with use of a photomask depicting a hole pattern of the holes to be formed. In exposure, position alignment between the photomask and the silicon substrate 11 is performed using the position of the notch formed in the silicon substrate 11 as a reference. By the position alignment, each of the holes depicted on the photomask is precisely transferred to the same position among silicon substrates 11 different from each other. When the exposure is completed, a developing treatment is performed. When the developing treatment is completed, a hole pattern by the photoresist is formed at a position on the silicon substrate 11 where the holes 16 are to be formed.

When the hole pattern by the photoresist has been formed, the holes 16 are formed in the silicon substrate 11 by etching. The etching is performed, for instance, by a RIE (Reactive Ion Etching) process. For instance, it is possible to use a mixed gas of sulfur hexafluoride ($SF_6$) and cyclobutane octafluoride ($C_4F_8$), as an etching gas. Further, the etching gas may contain a gas including other halogens such as chlorine. The etching to be used in forming the holes is performed with use of a difference in the etching rate between silicon in a silicon substrate and a silicon oxide film. In view of the above, a gas with etching rate of a silicon oxide film is smaller than the etching rate of silicon is used as the etching gas. Use of a gas with smaller etching rate of a silicon oxide film makes it possible to use the silicon oxide film as an etching stopper layer. Use of a gas with smaller etching rate of a silicon oxide film makes it possible to form the holes 16 extending through the silicon substrate, while suppressing etching of the silicon oxide film.

The etching is ended based on a predetermined time, which is calculated from the thickness of the silicon substrate, the etching rate, and the like. Further, it is also possible to use a method of managing the end of etching, with use of an end point sensor utilizing a difference in optical characteristics between a silicon substrate and a silicon oxide film. The end point sensor judges whether etching is ended by detecting a change in optical characteristics, which appears on the surface of the silicon oxide film layer after the etching of the silicon substrate is ended.

When the etching is ended, photoresist residues remaining on the substrate surface are removed by ashing, washing, or the like. When the photoresist residues are removed, the step of forming the holes 16 is completed. In the previous description, a method in which a photolithography process and an etching process are combined has been described. Alternatively, the holes 16 may be formed with use of a metal masking process. In the metal masking process, etching of a silicon substrate is performed with use of a metal film including an opening pattern corresponding to the holes 16, as a mask. In the metal masking process, the number of steps is reduced, as compared with a photolithography process, because a step of applying and exposing a photoresist, and a developing step can be omitted.

When the holes 16 have been formed, the insulating layer 14 is formed next. A silicon oxide film as the insulating layer 14 is formed on the SOI layer 13, while using the surface of the silicon substrate on the side of the SOI layer 13, as the substrate surface. The silicon oxide film of the insulating layer 14 is formed by a PECVD (Plasma-Enhanced Chemical Vapor Deposition) process, for instance. When the insulating layer 14 has been formed, the support substrate 11 formed with each layer is carried to a step of forming the wiring layer 15.

When the support substrate 11 is carried to the step of forming the wiring layer 15, a film of a wiring material such as aluminum or copper is formed on the insulating layer 14. When the wiring material is aluminum, a metal film of the wiring layer 15 is formed by forming a film of aluminum of a thickness corresponding to a predetermined thickness of a wiring film by a sputtering process, for instance. When the wiring material is copper, a film is formed by combining a sputtering process and a plating process, or by a MOCVD (Metal Organic Chemical Vapor Deposition) process.

When the film of a wiring material has been formed, a photoresist is applied on the wiring layer 15. The applied photoresist is exposed with use of a photomask depicting a wiring pattern or a pad pattern. In the exposure, position alignment between the photomask and the silicon substrate 11 is performed using the position of the notch formed in the silicon substrate 11 as a reference. When the exposure is completed, developing is performed, and a wiring pattern or a pad pattern is formed on the silicon substrate by the photoresist. When the developing is completed, etching is performed with use of the photoresist as an etching mask. A metal portion on the wiring layer 15 other than the wiring pattern or the pad pattern is removed by etching, and the wiring pattern or the pad pattern is formed of a wiring material. When the etching is completed, photoresist residues are removed by washing or the like, and formation of the wiring layer 15 is completed.

At the time of exposure in the step of forming the holes 16 and in the step of forming the wiring layer 15, position alignment using the notch as a reference is performed. Therefore, it is possible to align the positions of the holes 16 and the position of the wiring pattern of the wiring layer 15 with each other. In the step of forming the wiring layer 15, the process of forming the insulating layer 14 and the wiring material film, and the process of applying, exposing, developing, and etching a photoresist may be repeated multiple times. As described above, it is possible to form the wiring layer 15 having a coplanar wiring pattern on a silicon substrate as the support substrate 11. The support substrate 11 formed with the wiring layer 15 is carried to a step of forming a protection layer on the substrate surface, polishing the backside surface of the support substrate 11, dicing, and the like. In this way, manufacturing a coplanar wiring substrate is completed.

In the exemplary embodiment, only the position alignment using a notch as a reference is performed at the time of exposure in the step of forming the wiring layer 15. Alternatively, it is possible to use a position aligning method using an alignment marker as a reference for position alignment at the time of exposure in the step of forming the wiring layer 15. In this case, concurrently with forming the holes 16, a hole of a cross pattern or the like as an alignment marker is formed at a predetermined position. The hole as the alignment marker also penetrates the silicon substrate 11 at the time of etching. At the time of exposure in the step of forming the wiring layer 15, position alignment between the photomask and the silicon substrate is performed by reading the position of the alignment marker by a camera from the wiring layer 15 side. The hole as the alignment marker penetrates the silicon substrate 11. Therefore, optical contrast is generated between a portion where the silicon substrate 11 remains, and a portion corresponding to the hole as the alignment marker. This makes it possible to detect the alignment marker from the wiring layer 15 side by a camera.

It is also possible to use a method, in which the hole as the alignment marker is formed in the outer periphery of the silicon substrate 11, and a metal film around the hole as the alignment marker is removed after depositing the material film. Removing the metal film at a position where the hole as the alignment marker is formed for suppressing reflection from the metal film makes it easy to read the alignment marker. This is advantageous in enhancing the precision in position alignment.

Figure 3:
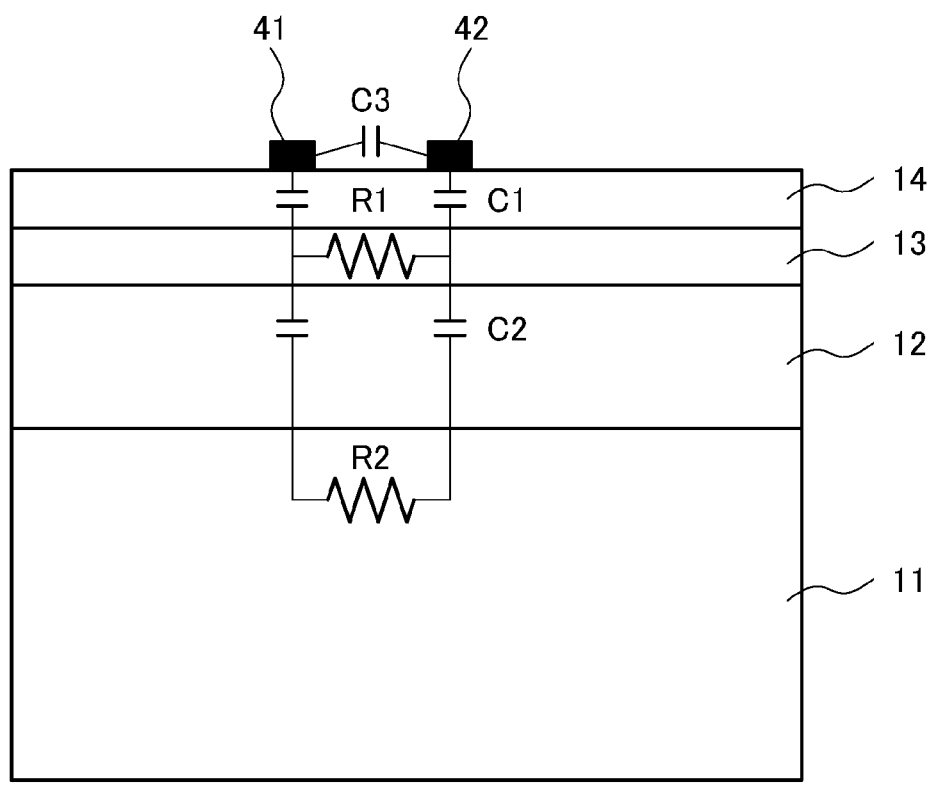
FIG. 3 is a diagram illustrating an electrical component between wirings in the first embodiment.

Next, characteristics of the coplanar wiring substrate in the exemplary embodiment will be described. FIG. 3 schematically illustrates capacitances and resistances generated directly between wirings, or via each layer. In FIG. 3, only one GND wiring 42 is illustrated to simplify the description. A capacitance C3 is generated by coupling between wirings i.e. between the signal wiring 41 and the GND wiring 42. Further, a capacitance C1 is generated in the insulating layer 14, and a resistance R1 is generated in the SOI layer 13 as a semiconductor layer, between the signal wiring 41 and the GND wiring 42. Furthermore, a capacitance C2 is generated in the BOX layer 12, and a resistance R2 is generated in the silicon substrate i.e. the support substrate 11 as a semiconductor layer, between the signal wiring 41 and the GND wiring 42. A signal to be transmitted by the signal wiring 41 is affected by the capacitances and the resistances. Therefore, the signal to be transmitted by the signal wiring 41 is attenuated.

Figure 4:
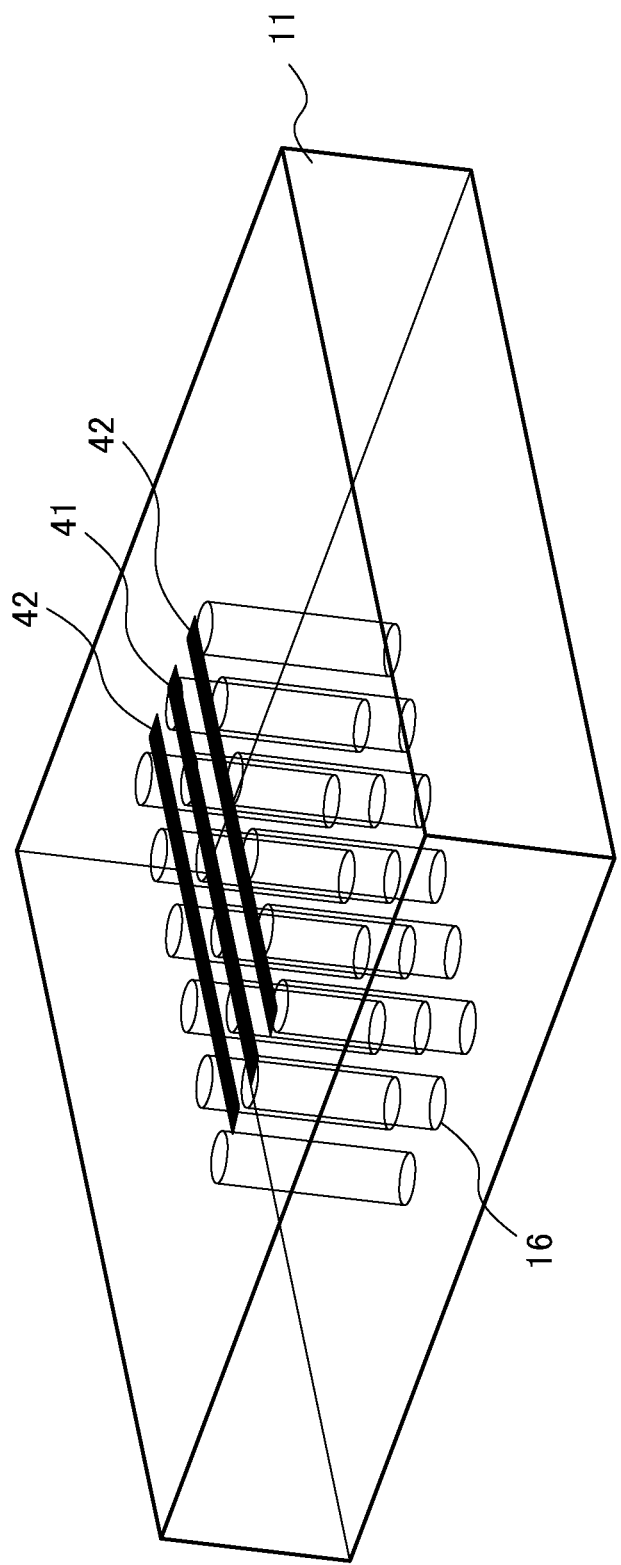
FIG. 4 is a diagram illustrating a structure based on the premise that an electrical field simulation is performed in the first embodiment.

Next, a calculation result on attenuation characteristics of a signal in the coplanar wiring substrate in the exemplary embodiment will be described, with use of an electromagnetic field simulator. FIG. 4 illustrates a structure based on the premise that attenuation characteristics of a signal are calculated with use of an electromagnetic field simulator. As illustrated in FIG. 4, the structure based on the premise that an electromagnetic field simulation is performed is a structure, in which the signal wiring 41, the two GND wirings 42, and the holes 16 in a lattice pattern are formed on a silicon substrate as the support substrate 11. Further, in FIG. 4, illustration of the BOX layer 12, the SOI layer 13, and the insulating layer 14 is omitted. The length of the signal wiring 41 in calculating attenuation characteristics of a signal by an electromagnetic field simulation is set to be 500 µm.

Figure 5:
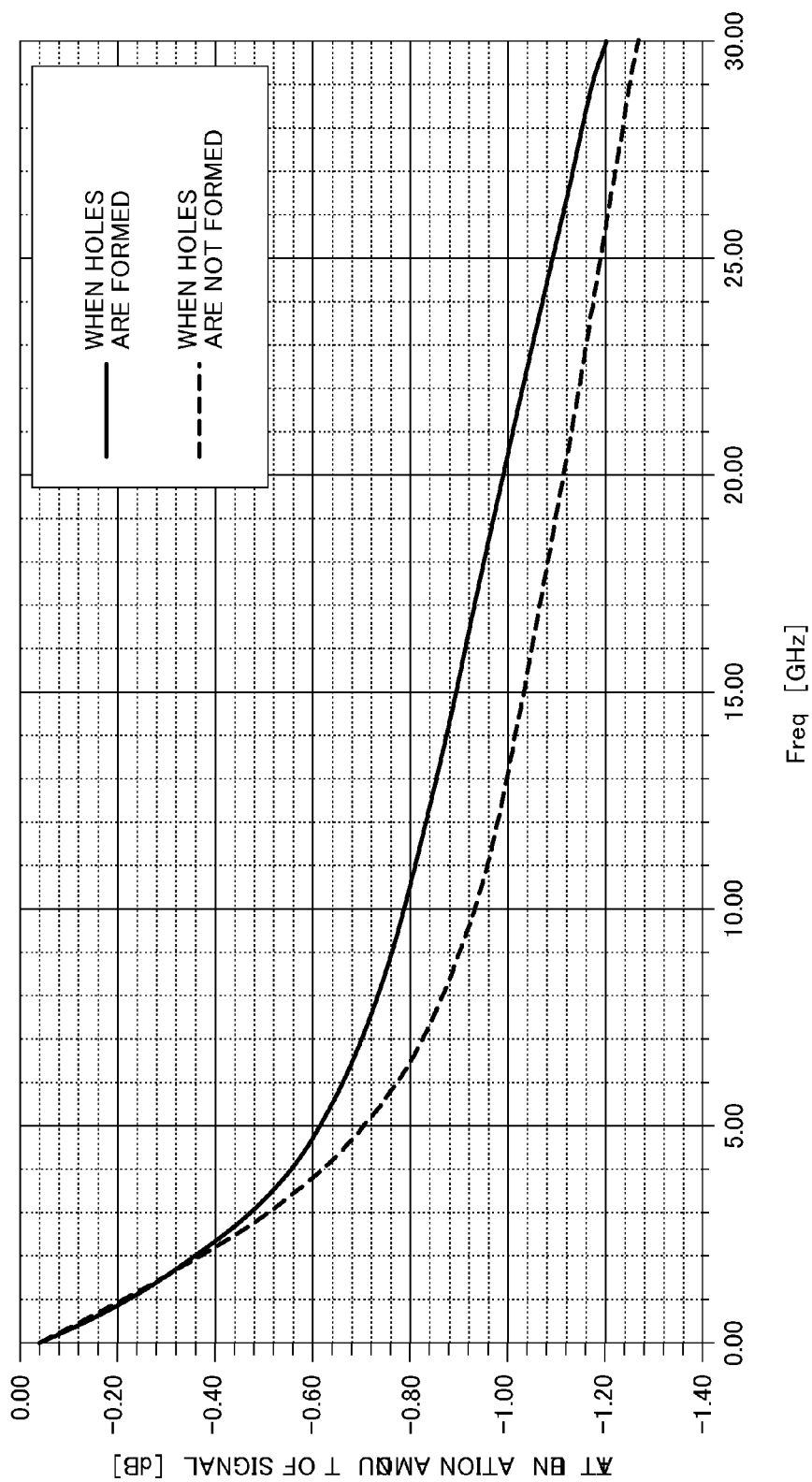
FIG. 5 is a diagram illustrating attenuation characteristics of a signal in the first embodiment.

FIG. 5 is a graph illustrating a calculation result on attenuation characteristics of a signal with use of an electromagnetic field simulator. The horizontal axis in FIG. 5 indicates a frequency of a signal, and the vertical axis in FIG. 5 indicates an attenuation amount of a signal. The attenuation amount of a signal is expressed in the unit of decibel. The solid line in FIG. 5 indicates attenuation characteristics when the holes 16 in a lattice pattern are formed in a silicon substrate, and the broken line in FIG. 5 indicates attenuation characteristics when the holes 16 are not formed. As illustrated in FIG. 5, the attenuation amount is small when the holes 16 are formed. For instance, when the attenuation amount of a signal when the holes 16 are formed, and the attenuation amount of a signal when the holes 16 are not formed are compared with each other in a frequency region of from about 10 GHz to about 20 GHz in terms of the value expressed in the unit of decibel, the attenuation amount of a signal when the holes 16 are formed is reduced by about 20%.

In the exemplary embodiment, there has been described a flow of sequence from formation of the BOX layer 12 on a silicon substrate as the support substrate 11 to formation of the wiring layer 15. Alternatively, it is also possible to perform a method, in which a substrate in the course of manufacturing is temporarily stored, and the substrate is carried to a subsequent step, as necessary. For instance, it is possible to store a substrate in a stage where the BOX layer 12 and the SOI layer 13 are formed on a silicon substrate as the support substrate 11, and to resume the manufacturing from the step of forming the holes 16. Further, it is possible to prepare a substrate formed with the BOX layer 12, the SOI layer 13, and the holes 16, and to resume the manufacturing from the step of forming the insulating layer 14. In the above configuration, it is possible to store a substrate formed with the holes 16 as a common member, and to commonly use the substrate without depending on the design of the wiring pattern of the insulating layer 15. Further, it is also possible to use a method, in which a substrate formed with the insulating layer 14 is stored, and manufacturing is resumed from the step of forming the wiring layer 15. As described above, it is easy to manage the steps in manufacturing the coplanar wiring substrate in the exemplary embodiment, because the number of steps of temporarily suspending the manufacturing is large.

In the coplanar wiring substrate in the exemplary embodiment, it is possible to reduce a resistance generated in a silicon substrate as the support substrate 11 by forming the holes 16 in a layer below the wirings. According to the above configuration, it is possible to reduce attenuation of a signal, which is generated in transmitting the signal by a signal wiring. The coplanar wiring substrate in the exemplary embodiment is provided with the BOX layer 12 as an upper layer of the silicon substrate. Therefore, it is possible to form the holes 16, while using the BOX layer 12 as an etching stopper film. Thus, it is possible to completely remove the silicon substrate at a portion where the holes 16 are formed. This is advantageous in reducing attenuation of a signal resulting from a resistance of a silicon substrate. Use of the BOX layer 12 as an etching stopper film makes it easy to control the timing of ending the etching. Thus, there is no need to configure a complicated process, or to prepare a device and/or a configuration and the like corresponding to the process. This is advantageous in avoiding complication of the manufacturing process. Further, the holes 16 are formed in a lattice pattern. Therefore, the support substrate 11 can retain a predetermined mechanical strength, and there is no likelihood that reliability may be lowered resulting from an insufficient mechanical strength. As described above, the coplanar wiring substrate in the exemplary embodiment is advantageous in preventing attenuation of a signal while retaining reliability, without complicating the manufacturing process and the like.

Figure 6:
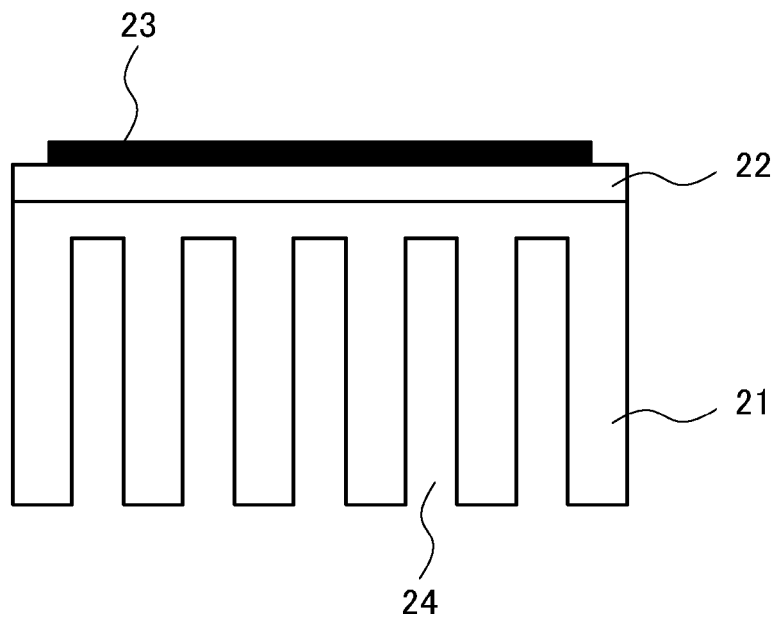
FIG. 6 is a diagram illustrating an outline of a configuration of the second embodiment.

Next, a second exemplary embodiment of the invention will be described in detail with reference to a drawing. FIG. 6 illustrates an outline of a configuration of a coplanar wiring substrate in the exemplary embodiment. In the coplanar wiring substrate in the first exemplary embodiment, a coplanar wiring is formed on a substrate provided with an SOI layer. In the coplanar wiring substrate in the exemplary embodiment, a coplanar wiring is formed on a substrate on which an SOI layer is not formed.

The coplanar wiring substrate in the exemplary embodiment is provided with a support substrate 21, an insulating layer 22, and a wiring layer 23. Further, a plurality of holes 24 are formed in the support substrate 21.

The function of the support substrate 21 is substantially the same as in the first exemplary embodiment. Also, in the exemplary embodiment, a single crystal silicon substrate is used as the support substrate 21. For instance, it is possible to use a silicon substrate of 0.7 mm in thickness as the silicon substrate. Further, the silicon substrate is formed with a portion in the shape for adjusting the position and the orientation of the silicon substrate at the time of manufacturing. As the portion in the shape for adjusting the position and the orientation of the substrate, for instance, a notch or an orientation flat is formed. In the exemplary embodiment, a silicon substrate formed with a notch is used.

The insulating layer 22 is formed with use of a silicon compound having insulation characteristics such as a silicon oxide ($SiO_2$) film, a silicon nitride (SiN) film, or a silicon oxide nitride (SiON) film. In the exemplary embodiment, the insulating layer 22 is formed of a silicon oxide film. Further, the film thickness of the insulating layer 22 is set to be 200 nm.

The wiring layer 23 is formed with use of a metal such as aluminum or copper, or an alloy of these metals and other metals. A predetermined circuit pattern is formed on the wiring layer 23 in accordance with the purpose of use of the coplanar wiring substrate. Further, the wiring layer 23 is constituted of a coplanar structure, in which a signal wiring and a GND wiring adjoin each other on one layer. In the exemplary embodiment, the wiring layer 23 is formed of aluminum. Further, the film thickness of the wiring layer 23 is set to be 200 nm. In the previous description, the film thickness of each of the insulating layer 22 and the wiring layer 23 is described as an example. The film thickness of each of the insulating layer 22 and the wiring layer 23 is set based on electrical characteristics required in the coplanar wiring substrate.

The holes 24 are formed in a silicon substrate as the support substrate 21. The holes 24 are formed to extend halfway through the silicon substrate from a surface of the silicon substrate opposite to the surface thereof where the insulating layer 22 is formed so as not to penetrate the silicon substrate. Specifically, the holes 24 and the insulating layer 22 do not come into contact with each other. Further, the holes 24 are formed to be arranged in the same pattern as in the first exemplary embodiment.

A coplanar wiring substrate manufacturing method in the exemplary embodiment will be described. First, the holes 24 are formed in the backside surface of a silicon substrate as the support substrate 21. The backside surface of the silicon substrate is a surface opposite to the surface where a polishing treatment or the like is performed for forming an element and the like. Formation of the holes 24 is performed by combining a photolithography process and an etching process. When the step of forming the holes 24 is started, a photoresist is applied on the backside surface of the silicon substrate. The applied photoresist is exposed with use of a photomask depicting a hole pattern of the holes to be formed. In the exposure, position alignment using the position of a notch in the silicon substrate as a reference is performed. When the exposure is completed, a developing treatment is performed. When the developing treatment is completed, a hole pattern by a photoresist is formed at a position on the silicon substrate where the holes 24 are formed.

When the hole pattern by the photoresist is formed, the holes 24 are formed in the silicon substrate by etching. The etching is performed, for instance, by a RIE (Reactive Ion Etching) process. For instance, it is possible to use a mixed gas of sulfur hexafluoride ($SF_6$) and cyclobutane octafluoride ($C_4F_8$), as an etching gas. The etching is performed for a predetermined time. The predetermined time is set in such a manner that the holes 24 do not penetrate the silicon substrate in view of the etching rate of silicon by the etching gas, and the like. When the etching is ended, photoresist residues remaining on the substrate surface are removed by ashing, washing, or the like. When the photoresist residues are removed, the step of forming the holes 24 is completed. As with the first exemplary embodiment, in the exemplary embodiment, it is also possible to form the holes by combining a metal masking process and an etching process.

When the holes 24 have been completed, the insulating layer 22 is formed. The insulating layer 22 is formed by forming a silicon oxide film by a PECVD process, for instance. When the insulating layer 22 has been formed, the support substrate 21 is carried to a step of forming the wiring layer 23. The wiring step is performed in the same manner as in the first exemplary embodiment. As described above, it is possible to form a coplanar wiring on a silicon substrate as the support substrate 21. When the wiring layer 23 has been formed, the support substrate 21 is carried to a step of forming a protection layer on the substrate surface. In this way, manufacturing a coplanar wiring substrate is completed.

In the exemplary embodiment, the holes 24 are formed before the insulating layer 22 is formed. Alternatively, the holes 24 may be formed after the insulating layer 22 is formed. When the holes 24 are formed after the insulating layer 22 is formed, it is also possible to configure a structure, in which the holes 24 penetrate the silicon substrate by forming the holes 24 in the insulating layer 22 as an etching stopper film.

In the coplanar wiring substrate in the exemplary embodiment, a resistance in a silicon substrate as the support substrate 21 is reduced by forming the holes 24 in the support substrate 21 as a lower layer of the wiring layer 23. According to the above configuration, it is possible to reduce attenuation of a signal to be transmitted by a signal wiring. The coplanar wiring substrate in the exemplary embodiment is not provided with an SOI layer and the like. Therefore, the number of steps required for manufacturing is small, as compared with the first exemplary embodiment. Further, it is possible to form the holes 24, without depending on the design of structures of other elements, which are required for forming the holes 24 in the backside surface. This is advantageous in avoiding complication of the manufacturing process. Thus, the coplanar wiring substrate in the exemplary embodiment makes it possible to reduce attenuation of a signal, while reducing the number of steps at the time of manufacturing.

In the first and second exemplary embodiments, there have been described examples, in which a coplanar wiring is formed. It is also possible to apply the structure provided with a hole including an opening portion in the backside surface of a silicon substrate as a support substrate to a signal wiring structure other than the coplanar structure.

Figure 7:
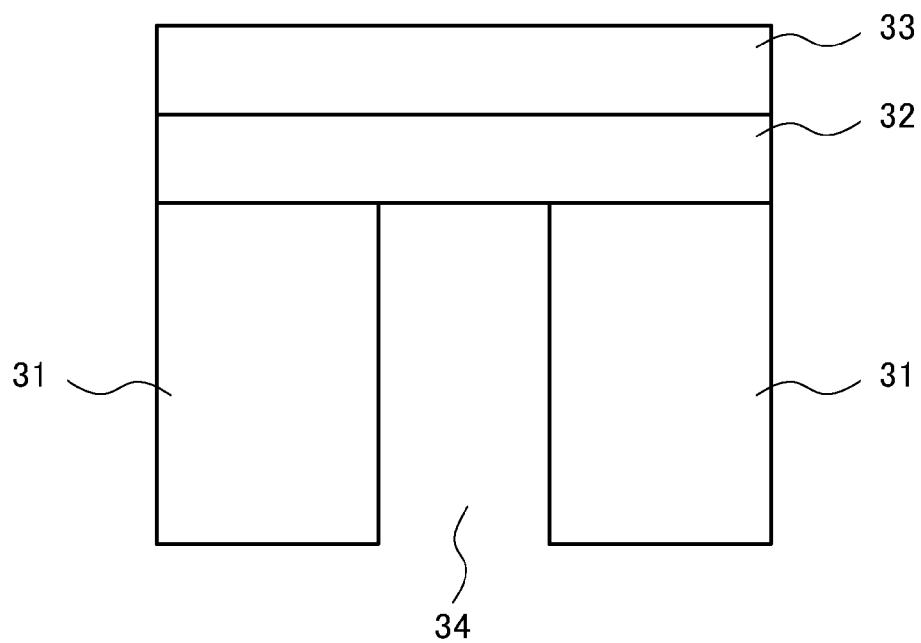
FIG. 7 is a diagram illustrating an outline of a configuration of the third embodiment.

A third exemplary embodiment of the invention will be described in detail with reference to a drawing. FIG. 7 illustrates an outline of a configuration of a wiring substrate in the exemplary embodiment. The wiring substrate in the exemplary embodiment is provided with a support substrate 31, an insulating layer 32, and a wiring layer 33. The support substrate 31 is formed with a hole 34 having an opening portion in one surface thereof. The insulating layer 32 is formed on the surface of the support substrate 31 opposite to the surface thereof including the opening portion. The wiring layer 33 has a wiring pattern of a predetermined structure on the insulating layer 32. Further, an orthographic projection to be obtained when the wiring pattern is projected on a predetermined surface of the support substrate 31, and an orthographic projection to be obtained when the hole 34 is projected on the predetermined surface of the support substrate 31 include a shared portion.

In the wiring substrate in the exemplary embodiment, a hole is formed in the support substrate at a position below the wiring pattern. Forming the hole at a position below the wirings makes it possible to reduce a resistance generated between the wirings via the support substrate. Reducing a resistance generated between the wirings via the support substrate is advantageous in reducing signal attenuation. Further, forming the opening portion of the hole in the surface opposite to the insulating layer makes it easy to form the hole in the support substrate. According to the above configuration, the wiring substrate in the exemplary embodiment is advantageous in reducing signal attenuation without the need for a complicated step and the like.

The previous description of embodiments is provided to enable a person skilled in the art to make and use the present invention. Moreover, various modifications to these exemplary embodiments will be readily apparent to those skilled in the art, and the generic principles and specific examples defined herein may be applied to other embodiments without the use of inventive faculty. Therefore, the present invention is not intended to be limited to the exemplary embodiments described herein but is to be accorded the widest scope as defined by the limitations of the claims and equivalents.

Further, it is noted that the inventor's intent is to retain all equivalents of the claimed invention even if the claims are amended during prosecution.

The invention claimed is:

1. A wiring substrate comprising:
a support substrate formed with a plurality of holes, each hole including an opening portion in one surface of the support substrate;
an insulating layer formed on a surface of the support substrate opposite to the one surface including the opening portion;
a wiring layer including a wiring pattern of a predetermined structure on the insulating layer,
wherein the holes are arranged in a lattice pattern over the entire surface of the support substrate, and materials of the support substrate between the holes have a continuous structure; and
a silicon oxide film layer and a single crystal silicon layer, between the support substrate and the insulating layer in the order from a side of the support substrate,
wherein each said hole extends through the support substrate to a surface on a side of the silicon oxide film layer.

2. The wiring substrate according to claim 1, wherein the wiring pattern and at least a part of the lattice pattern of holes overlap each other.

3. A wiring substrate comprising:
a support substrate with a first surface and a second surface;
a plurality of holes arranged in a lattice pattern over an entirety of the first surface of the support substrate, each hole including an opening portion in the first surface of the support substrate;
an insulating layer having a first surface and a second surface, the first surface of the insulating layer facing the second surface of the support substrate;
a wiring layer including a wiring pattern of a predetermined structure, a first surface of the wiring layer being located on the second surface of the insulating layer,
wherein materials of the support substrate between the holes have a continuous structure, and
wherein the wiring pattern is in vertical alignment overlapping at least some of the holes;
a silicon oxide film layer having a first surface located against the second surface of the support substrate; and
a single crystal silicon layer having a first surface located against a second surface of the silicon oxide film layer and a second surface located against the first surface of insulating layer,
wherein each said hole extends completely through the support substrate to the first surface of the silicon oxide film layer.

4. A wiring substrate manufacturing method comprising:
a step of forming a silicon oxide film layer on a support substrate;
step of forming the single crystal silicon layer on the silicon oxide film layer;
a step of forming a plurality of holes, each hole in one surface of the support substrate;
a step of forming an insulating layer on the single crystal silicon layer; and
a step of forming a wiring pattern of a predetermined structure on the insulating layer,
wherein the holes are arranged in a lattice pattern over the entire surface of the support substrate, and materials of the support substrate between the holes have a continuous structure, and
wherein each said hole is formed to penetrate completely through the support substrate.

5. The wiring substrate manufacturing method according to claim 4, wherein the wiring pattern and at least a part of the lattice pattern of holes overlap each other.

* * * * *